United States Patent
Tamba

(10) Patent No.: US 7,719,451 B2
(45) Date of Patent: May 18, 2010

(54) SIGNAL MEASURING APPARATUS AND SEMICONDUCTOR TESTING APPARATUS

(75) Inventor: Mamoru Tamba, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 11/979,581

(22) Filed: Nov. 6, 2007

(65) Prior Publication Data
US 2008/0109179 A1    May 8, 2008

(30) Foreign Application Priority Data
Nov. 8, 2006    (JP)    .............. 2006-302639

(51) Int. Cl.
*H03M 1/10*    (2006.01)
(52) U.S. Cl. ...................... 341/120; 341/155
(58) Field of Classification Search ................ 341/120, 341/155, 156, 118
See application file for complete search history.

(56) References Cited

U.S. PATENT DOCUMENTS

| | | | |
|---|---|---|---|
| 6,979,993 B2 * | 12/2005 | Kurosawa | 324/76.33 |
| 7,106,236 B2 * | 9/2006 | Asami et al. | 341/155 |
| 7,289,053 B2 * | 10/2007 | Bunin | 341/156 |
| 2004/0080442 A1 * | 4/2004 | Asami | 341/155 |
| 2006/0097901 A1 * | 5/2006 | Draxelmayr et al. | 341/155 |

FOREIGN PATENT DOCUMENTS

| | | |
|---|---|---|
| JP | 04-036672 A | 2/1992 |
| JP | 07-002978 A | 1/1995 |
| JP | 11-017549 A | 1/1999 |
| JP | 2003-318737 A | 11/2003 |

OTHER PUBLICATIONS

JP Notice of Allowance, dated Dec. 8, 2009, issued in corresponding JP Application No. 2006-302639, 6 pages English and Japanese.

* cited by examiner

*Primary Examiner*—Rexford N Barnie
*Assistant Examiner*—Joseph Lauture
(74) *Attorney, Agent, or Firm*—Sughrue Mion, PLLC

(57) ABSTRACT

In order to provide a signal measuring apparatus which satisfies multiple performances at a high level all together, the signal measuring apparatus includes: DC performance; noise performance; distortion performance; spurious performance; and the like, a signal measuring apparatus includes: multiple A/D converters which respectively have different conversion characteristics for converting from an analog signal outputted from a DUT to digital signals; digital circuits which are provided in correspondence with the A/D converters and which conduct predetermined operations based on the conversion characteristics of the A/D converters.

11 Claims, 3 Drawing Sheets

SIGNAL MEASURING APPARATUS AND SEMICONDUCTOR TESTING APPARATUS

BACKGROUND OF THE INVENTION

1. Field of the Invention

The present invention relates to both a signal measuring apparatus which measures analog signals such as signals output from a device under test and a semiconductor testing apparatus which includes the signal measuring apparatus.

Priority is claimed on Japanese Patent Application No. 2006-302639, filed Nov. 8, 2006, the content of which is incorporated herein by reference.

2. Description of the Related Art

In conventional cases, a semiconductor testing apparatus such as a memory tester and a logic tester is used in order to test and/or check initial problems of devices under test. Such a semiconductor testing apparatus includes a signal measuring apparatus which provides an analog/digital converter (hereinafter, A/D converter) for converting analog signals output from the device under test to digital signals. The semiconductor testing apparatus conducts predetermined operations on the digital signals converted by the signal measuring apparatus in order to measure the analog signals output from the device under test.

Patent document 1 (Japanese Patent Application, First Publication No. H04-36672) discloses a semiconductor testing apparatus which tests multiple items in parallel with respect to a device under test which inputs and outputs mixed signals including various signals such as a DC signal, an analog signal and a digital signal.

Regarding the above-described semiconductor testing apparatus, it should be noted that there is an aspect in which an upper limit of a performance, ability or accuracy of measuring analog signals is mainly determined by a performance of the A/D converter. Therefore, with regard to the signal measuring apparatus included in the semiconductor testing apparatus which measures with high accuracy, it is necessary to provide an A/D converter with high performance. Here, with regard to the A/D converter which has high performance, there are various requirements such as ability to convert a DC (direct current) component of the analog signals with high accuracy (high DC performance), low noise (high noise performance), low distortion (high distortion performance), and low spurious component (high spurious performance). There are a very small number of the A/D converters which satisfy all of such requirements, and moreover, such A/D converters are very expensive.

For example, there are generally used A/D converters which are a delta-sigma ($\Delta\Sigma$) A/D converter and a successive approximation A/D converter. In general, the delta-sigma A/D converter has an excellent noise performance, but the delta-sigma A/D converter has large distortions (has a high level at high harmonics), that is, there is a tendency in which the delta-sigma A/D converter has lower distortion performance compared to the successive approximation A/D converter. On the other hand, the successive approximation A/D converter has an excellent distortion performance, but the successive approximation A/D converter generates large noise, that is, there is a tendency in which the successive approximation A/D converter has lower noise performance compared to the delta-sigma A/D converter.

Therefore, in conventional cases, a user selects an A/D converter which has an excellent performance with respect to one point among the above-described requirements which is important for the user and applies the selected A/D converter to the signal measuring apparatus, or the user selects a well-balanced A/D converter which has good performances to some degree with respect to all of the above-described requirements and applies the selected A/D converter to the signal measuring apparatus. Moreover, there is a proposal of a conventional technique in which a band-elimination filter is provided at a former step (input side) of an A/D converter in order to achieve both lower noise and lower distortion, and the user applies the A/D converter to which such a conventional technique is used to the signal measuring apparatus.

Here, the above-described conventional technique applying the band-elimination filter uses characteristics of an A/D converter in which a large distortion is generated if a large voltage is applied to the A/D converter, and decreases the distortion by using the band-elimination filter which removes a fundamental wave component having a large signal level from signals received by the A/D converter in order to decrease a level of input voltage. Moreover, a frequency of the band-elimination filter is measured beforehand, and signals output from the A/D converter are corrected or adjusted based on the measured results. Therefore, a signal level which is reduced by the band-elimination filter is recovered.

In accordance with such a conventional technique, it is possible to achieve low noise and low distortion, but there is a problem in which a frequency of signals measured is limited by frequency characteristics of the band-elimination filter. There is a possibility in which it is possible to measure with regard to a wide frequency range if multiple band-elimination filters with different frequency characteristics are applied. However, there is another problem in which a size of a circuit increases along with an increase of a number of band-elimination filters. Moreover, in the above-described conventional technique, there is a precondition in which the band-elimination filter never generates distortions. However, in practical cases, there is a problem in which it is difficult to produce a band-elimination filter which generates low distortion.

SUMMARY OF THE INVENTION

The present invention is conceived in order to solve the above-described problems, has an objective to provide a signal measuring apparatus which satisfies various requirements at a high level all together such as DC performance, noise performance, distortion performance, and spurious performance, and has an objective to provide a semiconductor testing apparatus which provides the signal measuring apparatus.

In order to resolve the above-described problems, a signal measuring apparatus (10) of a first aspect measures an analog signal (S10) by converting from the analog signal to digital signals (S11a-S11n), including a plurality of converters (11a-11n) which convert from the analog signal to digital signals and which respectively have different conversion characteristics.

The above-described signal measuring apparatus of the first aspect preferably includes a plurality of operation portions arranged in correspondence with the converters and each of which conducts a predetermined operation based on the conversion characteristics of the corresponding converter.

In accordance with the above-described signal measuring apparatus, the analog signal is inputted to the multiple converters which respectively have different conversion characteristics and is converted to the digital signals. The operation portions provided in correspondence with the converters conduct predetermined operations on the inputted digital signals based on the conversion characteristics of the corresponding converters.

With respect to the above-described signal measuring apparatus of the first aspect, each of the converters preferably has one performance which is better than other converters and which is included in a plurality of performances used for evaluating the conversion characteristics.

With respect to the above-described signal measuring apparatus of the first aspect, the plurality of performances used for evaluating the conversion characteristics preferably include at least one of DC performance, noise performance, distortion performance and spurious performance.

Moreover, with respect to the above-described signal measuring apparatus of the first aspect, each of the operation portions preferably obtains a measurement result with regard to the performance of the corresponding converter which is better than other converters and which is obtained by conducting a frequency analysis on the digital signal outputted from the corresponding converter.

Furthermore, in order to resolve the above-described problems, a signal measuring apparatus of a second aspect which is the above-described apparatus, preferably includes a signal processing portion which mixes the digital signals outputted from the converters in order to obtain measurement results with regard to a plurality of performances which are used for evaluating the conversion characteristics.

In accordance with the above-described signal measuring apparatus, the analog signal is inputted by the multiple converters which respectively have different conversion characteristics and is converted to the digital signals. The signal operation portion mixes the converted digital signals and conducts operations in order to obtain measurement results with regard to multiple performances used for evaluating the conversion characteristics of the converters.

With regard to the above-described signal measuring apparatus of the second aspect, the signal processing portion preferably includes: frequency analysis portions (41a and 41b) which conduct a signal analysis on the digital signals outputted from the converters; extracting portions (42a and 42b) which extract predetermined frequency components corresponding to the conversion characteristics of the converters based on analysis results of the frequency analysis portions; and a mixing portion (43) which mixes the frequency components extracted by the extracting portion.

With regard to the above-described signal measuring apparatus of the second aspect, each of the converters preferably has one performance which is better than other converters and which is included in the plurality of performances used for evaluating the conversion characteristics.

With regard to the above-described signal measuring apparatus of the second aspect, the plurality of performances used for evaluating the conversion characteristics preferably include at least one of DC performance, noise performance, distortion performance and spurious performance.

It is possible to apply the above-described signal measuring apparatus to a semiconductor testing apparatus for testing a device under test (20) which uses the signal measuring apparatus in order to measure an analog signal outputted from the device under test.

In accordance with the above-described aspects, multiple converters are provided which have respectively different conversion characteristics and which convert from analog signals to digital signals. A predetermined operation determined based on the conversion characteristics of the converter is conducted on the converted digital signals by using an operation portion provided by the converter. Moreover, the multiple converters are provided which respectively have different conversion characteristics and which convert from analog signals to digital signals, and the converted digital signals are mixed by using a conversion operation portion in order to obtain measurement results with respect to multiple performances for evaluating conversion characteristics of the converter. Therefore, there is an advantage which satisfies various requirements at a high level all together such as DC performance, noise performance, distortion performance, and spurious performance.

DETAILED DESCRIPTION OF THE INVENTION

Hereinafter, a signal measuring apparatus and a semiconductor testing apparatus of the following embodiments of the present invention are explained in reference to drawings.

First Embodiment

Figure 1:
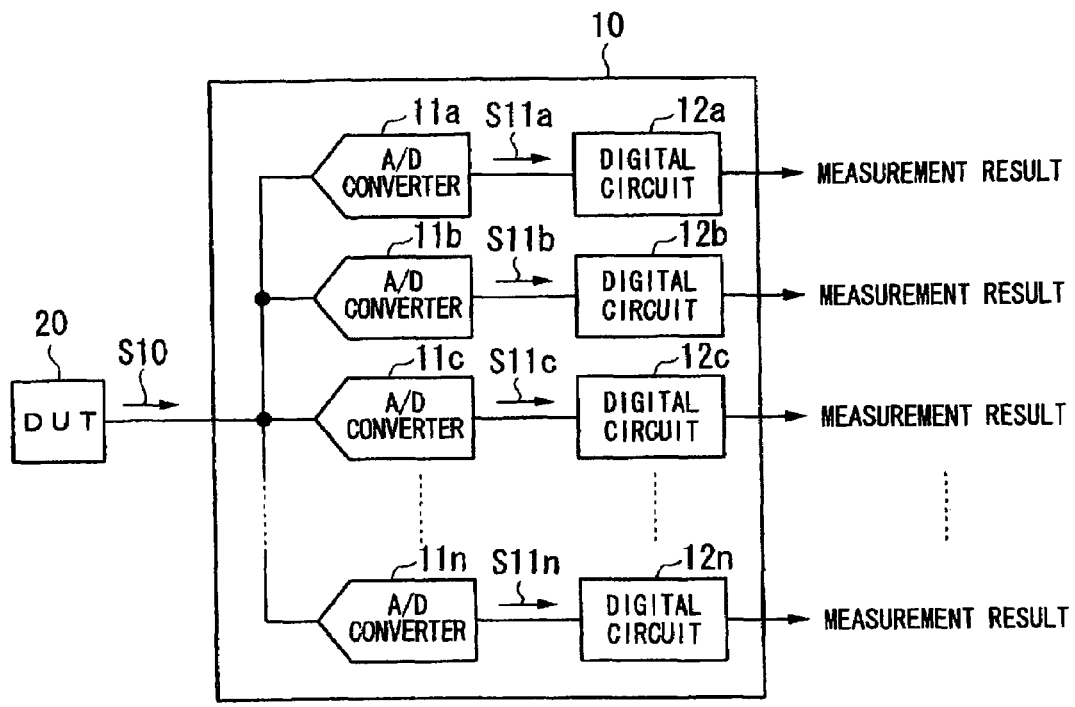
FIG. 1 is a block diagram which shows an outline constitution of a signal measuring apparatus of a first embodiment.

FIG. 1 is a block diagram which shows an outline constitution of a signal measuring apparatus of a first embodiment of the present invention. As shown in FIG. 1, a signal measuring apparatus 10 of the first embodiment includes both multiple A/D converters 11a-11n (converter) and multiple digital circuits 12a-12n (operation portion) which correspond to the A/D converters 11a-11n. The signal measuring apparatus 10 measures an analog signal S10 output from a device under test (hereinafter, DUT) 20.

Input terminals of the A/D converters 11a-11n are connected together, and each of the A/D converters 11a-11n inputs the analog signal S10 which is output from the DUT 20. The A/D converters 11a-11n conduct a sampling operation and a quantization operation on the input analog signal S10 in order to convert from the analog signal S10 to digital signals S11a-S11n. Here, the A/D converters 11a-11n are applied which respectively have different conversion characteristics for converting from the analog signal S10 to the digital signals S11a-S11n.

In a practical case, the A/D converters 11a-11n are applied each of which has a better performance included in multiple performances which are used for evaluating conversion characteristics of the A/D converter than the other A/D converters. Here, for example, the multiple performances used for evaluating conversion characteristics of the A/D converter include such as DC performance, noise performance, distortion performance, and spurious performance. The A/D converters 11a-11n are applied each of which has a better performance included in such the multiple performances than the other A/D converters.

For example, more concretely, the A/D converter 11a has a better DC performance than the other A/D converters 11b-11n and converts DC (direct current) component of the analog signal with high accuracy. The A/D converter 11b has a better noise performance than the other A/D converters 11a and 11c-11n and generates lower noise. The A/D converter 11c has a better distortion performance than the other A/D converters 11a, 11b and 11d-11n and generates smaller distortions. The A/D converter 11d has a better spurious performance than the other A/D converters 11a-11c and 11e-11n and generates less spurious components. The A/D converters 11a-11n convert the analog signal S10 and output the digital signals S11a-S11n respectively.

Output terminals of the A/D converters 11a-11n are connected to input terminals of digital circuits 12a-12n respectively. With respect to the digital signals S11a-S11n outputted from the A/D converters 11a-11n, the digital circuits 12a-12n conduct predetermined operations corresponding to conversion characteristics of the A/D converters 11a-11n. Concretely, with respect to the digital signals S11a-S11n outputted from the A/D converters, each of the digital circuits 12a-12n conducts a frequency analysis operation in order to obtain a measurement result with regard to a higher performance of the digital circuit than the other digital circuits.

For example, more concretely, the digital circuit 12a conducts the frequency analysis operation on the digital signal S11a outputted from the A/D converter 11a which has better DC performance than the other A/D converters 11b-11n, and calculates a measurement result of DC performance. Moreover, the digital circuit 12b conducts the frequency analysis operation on the digital signal S11b outputted from the A/D converter 11b which has better noise performance than the other A/D converters 11a and 11c-11n, and calculates a measurement result of noise performance. Furthermore, in the same manner, the digital circuit 12c calculates a measurement result of distortion performance, and the digital circuit 12d calculates a measurement result of spurious performance. It should be noted that a host computer is connected to the digital circuits 12a-12n and inputs the signals outputted from the digital circuits 12a-12n.

According to the above-described constitution, when the analog signal S10 is outputted from the DUT 20, each of the A/D converters 11a-11n inputs the analog signal S10. Each of the A/D converters 11a-11n simultaneously conducts the sampling operation and the quantization operation on the analog signal S10, and the digital signals S11a-S11n are outputted. The digital circuits 12a-12n input the digital signals S11a-S11n respectively, and conduct the predetermined operations based on the conversion characteristics of the corresponding A/D converters 11a-11n. Concretely, the digital circuit 12a conducts an operation in order to obtain a measurement result with respect to the DC performance. The digital circuit 12b conducts an operation in order to obtain a measurement result with respect to the noise performance. The digital circuit 12c conducts an operation in order to obtain a measurement result with respect to the distortion performance. The digital circuit 12d conducts an operation in order to obtain a measurement result with respect to the spurious performance.

The measurement results obtained by conducting the above-described operations are transmitted to a host computer which is not shown in the drawings, and shown on a display of the host computer. In other words, the measurement result obtained by the digital circuit 12a is displayed as DC characteristics of the analog signal S10 outputted from the DUT 20, the measurement result obtained by the digital circuit 12b is displayed as noise characteristics of the analog signal S10 outputted from the DUT 20, the measurement result obtained by the digital circuit 12c is displayed as distortion characteristics of the analog signal S10 outputted from the DUT 20, and the measurement result obtained by the digital circuit 12d is displayed as spurious characteristics of the analog signal S10 outputted from the DUT 20.

The above-described signal measuring apparatus 10 of the first embodiment provides both the multiple A/D converters 11a-11n which respectively have different conversion characteristics and the digital circuits 12a-12n which conduct the predetermined operations respectively corresponding to the conversion characteristics of the A/D converters 11a-11n. Therefore, for example, it is possible to obtain the measurement results with respect to the noise performance of the analog signal 10S by using the digital signal S11b which is converted by the A/D converter 11b that has a good noise performance, and it is possible to obtain the measurement results with respect to the distortion performance of the analog signal 10S by using the digital signal S11c which is converted by the A/D converter 11c that has a good distortion performance. Therefore, the first embodiment can satisfy multiple performances at a high level all together such as DC performance, noise performance, distortion performance, and spurious performance.

Second Embodiment

Figure 2:
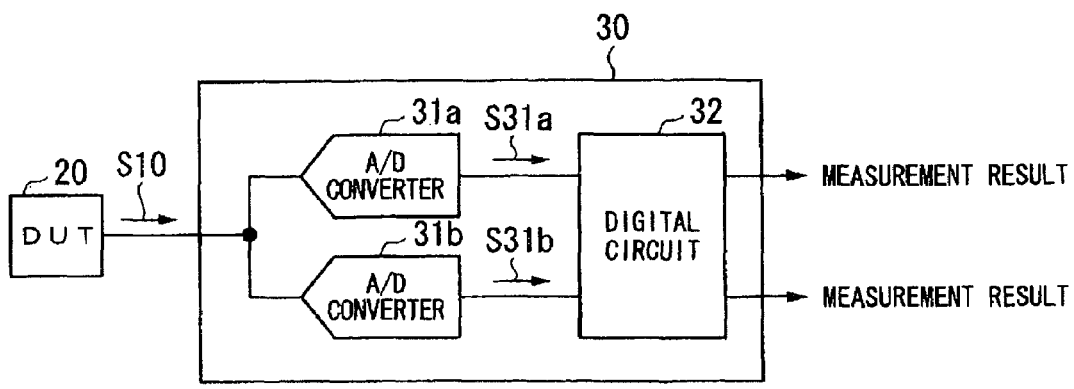
FIG. 2 is a block diagram which shows an outline constitution of a signal measuring apparatus of a second embodiment.

FIG. 2 is a block diagram which shows an outline constitution of a signal measuring apparatus of a second embodiment of the present invention. As shown in FIG. 2, a signal measuring apparatus 30 of this embodiment includes two A/D converters 31a and 31b (converters) provided in parallel and a digital circuit 32 (signal processing portion), and measures an analog signal S10 outputted from a DUT 20.

Input terminals of the A/D converters 31a and 31b are connected together, and each of the A/D converters 31a and 31b inputs the analog signal S10 which is output from the DUT 20. The A/D converters 31a and 31b conduct a sampling operation and a quantization operation on the input analog signal S10 in order to convert from the analog signal S11 to digital signals S31a and S31b. Here, the same as in the first embodiment, the A/D converters 31a and 31b are applied which respectively have different conversion characteristics for converting from the analog signal S10 to the digital signals S31a and S31b.

In a practical case, the A/D converters 31a and 31b are applied each of which has a better performance included in multiple performances which are used for evaluating conversion characteristics of the A/D converter than the other A/D converters. In this embodiment, the A/D converter 31a is a delta-sigma A/D converter, and the A/D converter 31b is a successive approximation A/D converter. In other words, the A/D converter 31a has a better noise performance and generates smaller noise than the A/D converter 31b, and the A/D converter 31b has a better distortion performance and generates smaller distortions than the A/D converter 31a. The A/D converters 31a and 31b convert the analog signal S10 and output the digital signals S31a and S31b respectively.

Output terminals of the A/D converters 31a and 31b are connected to an input terminal of the digital circuit 32. The digital circuit 32 mixes the digital signals S31a and S31b outputted from the A/D converters 31a and 31b, and conducts operations in order to obtain measurement results with respect to multiple performances for evaluating conversion characteristics of the A/D converter. In a concrete case, the digital circuit 32 mixes the digital signals S31a and S31b outputted from these A/D converters 31a and 31b in order to obtain measurement results with respect to a noise performance and a distortion performance because the A/D converter 31a has a better noise performance and the A/D converter 31b has a better distortion performance as described above. It should be noted that the digital circuit 32 is connected to a host computer which is not shown in the drawings.

Figure 3:
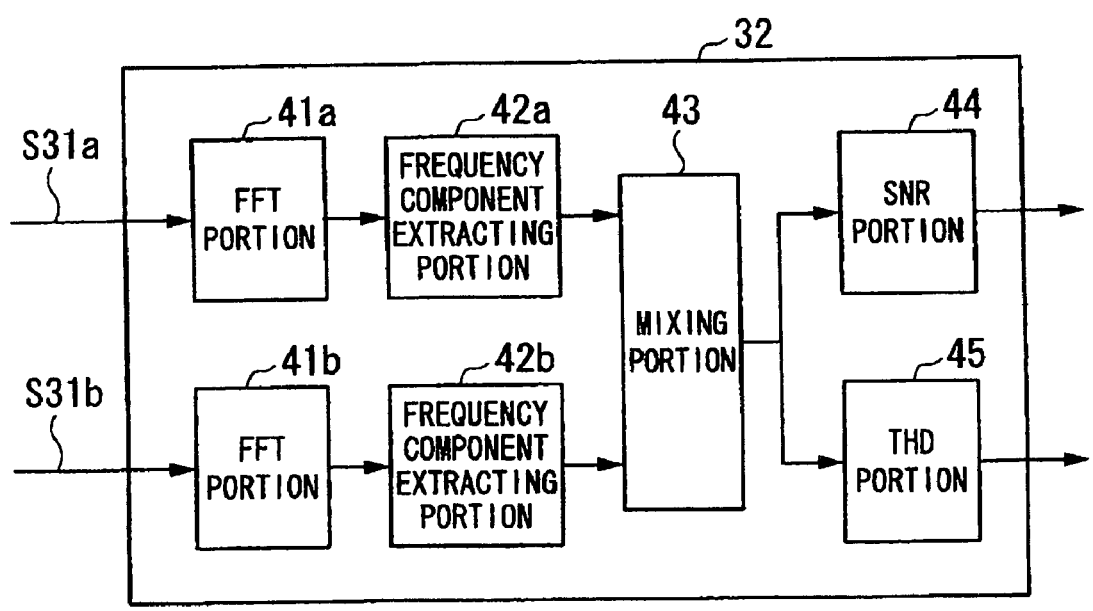
FIG. 3 is a block diagram which shows an internal constitution of a digital circuit.

FIG. 3 is a block diagram which shows an internal constitution of the digital circuit 32. As shown in FIG. 3, the digital circuit 32 provides FFT portions 41a and 41b (frequency analysis portion), frequency component extraction portions (extraction portion) 42a and 42b, a mixing portion 43, a SNR (Signal to Noise Ratio) portion 44 and a THD (Total Harmonic Distortion) portion 45. The FFT portion 41a inputs the digital signal S31a outputted from the A/D converter 31a and conducts a FFT (Fast Fourier Transfer) operation on the digital signal S31a in order to conduct a frequency analysis operation on the digital signal S31a. Same as the FFT portion 41a, the FFT portion 41b inputs the digital signal S31b outputted from the A/D converter 31b and conducts a FFT (Fast Fourier Transfer) operation on the digital signal S31b in order to conduct a frequency analysis operation on the digital signal S31b.

The frequency component extraction portion 42a extracts a predetermined frequency component from a signal outputted from the FFT portion 41a in accordance with the conversion characteristics of the A/D converter 31a. The same as the frequency component extraction portion 42a, the frequency component extraction portion 42b extracts a predetermined frequency component from a signal outputted from the FFT portion 41b in accordance with the conversion characteristics of the A/D converter 31b. Here, as described above, the A/D converter 31a has a better noise performance and the A/D converter 31b has a better distortion performance. Therefore, the frequency component extraction portion 42a extracts a frequency component which is necessary for obtaining the noise performance from the signal outputted by the FFT portion 41a, and extracts a frequency component which is necessary for obtaining the distortion performance from the signal outputted by the FFT portion 41b.

The mixing portion 43 mixes the extracted frequency components by the frequency component extracting portions 42a and 42b. The SNR portion 44 calculates a measurement result (Signal to Noise Ratio) with regard to a noise performance by using the signal which is mixed by the mixing portion 43. The THD portion 45 calculates a measurement result with regard to a distortion performance (THD: Total Harmonic Distortion) by using the signal which is mixed by the mixing portion 43.

In the above-described constitution, the analog signal S10 outputted from the DUT 20 is inputted by the A/D converters 31a and 31b respectively, and the A/D converters 31a and 31b simultaneously conduct both a sampling operation and a quantization operation on the analog signal S10 and output the digital signals S31a and S31b respectively. The digital circuit 32 inputs and mixes the digital signals S31a and S31b, and the measurement results with regard to the multiple performances which are used for evaluating the conversion characteristics of the A/D converter are calculated based on the mixed signal.

Concretely, the FFT portions 41a and 41b input the digital signals S31a and 31b respectively via the digital circuit 32, and conduct the Fast Fourier Transfer operation on the digital signals S31a and S31b. The frequency extracting portions 42a and 42b respectively input signals obtained by this analysis (FFT operation) and extract predetermined frequency components corresponding to the conversion characteristics of the A/D converters 31a and 31b. After that, the mixing portion 43 inputs and mixes the frequency components extracted by the frequency component extracting portion 42a and 42b.

Figure 4A:
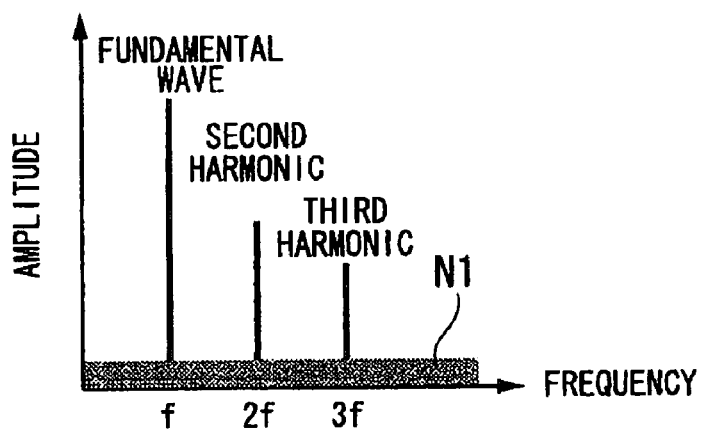
FIG. 4A is a drawing for explaining operations of a frequency component extracting portion.
Figure 4B:
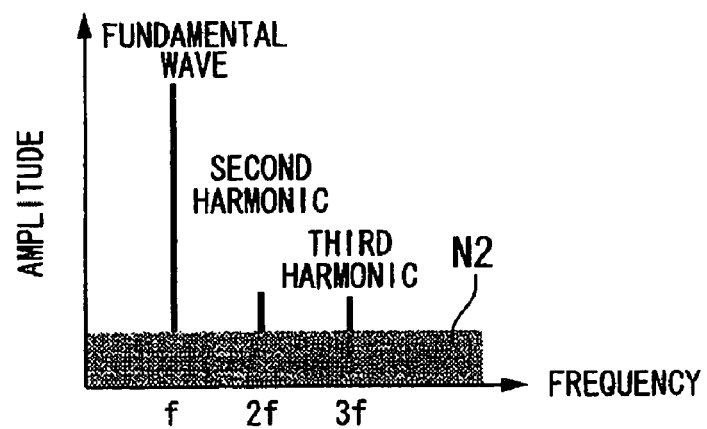
FIG. 4B is a drawing for explaining operations of a frequency component extracting portion.
Figure 4C:
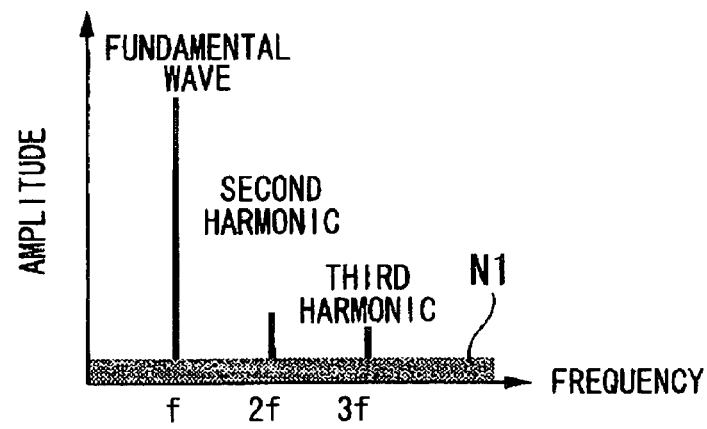
FIG. 4C is a drawing for explaining operations of a mixing portion.

FIG. 4 is a drawing for explaining operations of the frequency component extracting portions 42a and 42b and the mixing portion 43. Here, FIG. 4A is a drawing which shows an example of a frequency distribution obtained by the frequency analysis of the FFT portion 41a. FIG. 4B is a drawing which shows an example of a frequency distribution obtained by the frequency analysis of the FFT portion 41b. FIG. 4C is a drawing which shows an example of a frequency distribution of signals mixed by the mixing portion 43. It should be noted that "f" in FIGS. 4A-C is a frequency of a fundamental wave of the analog signal S10. Moreover, a frequency $2f$ shown in the drawings is a second harmonic with regard to the fundamental wave, and a frequency $3f$ is a frequency of a third harmonic with regard to the fundamental wave. Furthermore, N1 shown in FIG. 4A and N2 shown in FIG. 4B are noise components.

By comparing the frequency distributions shown in FIGS. 4A and 4B, it is observed that amplitudes of fundamental waves of FIGS. 4A and 4B are almost the same. However, with regard to the second harmonics and the third harmonics, it is observed that the amplitude shown in FIG. 4A is higher than the amplitude shown in FIG. 4B. This is because the A/D converter 31a has a lower distortion performance and generates larger distortions than the A/D converter 31b. Moreover, the noise component N2 included in the frequency distribution shown in FIG. 4B is larger than the noise component N1 included in the frequency distribution shown in FIG. 4A. This is because the A/D converter 31b has a lower noise performance and generates larger noise than the A/D converter 31a.

As shown in FIG. 4A, the A/D converter 31a generates low noise, but the A/D converter 31a generates large distortions. Therefore, the frequency component extracting portion 42a extracts frequency components except for harmonics components which cause distortions. In other words, the frequency component extracting portion 42a conducts an operation in which the second harmonics and the third harmonics are removed from the frequency distribution shown in FIG. 4A. On the other hand, as shown in FIG. 4B, the A/D converter 31b generates low distortions, but generates large noise. Therefore, the frequency component extracting portion 42b extracts harmonics portions from which the noise components are removed even if the noise component is included in the fundamental wave. That is, the frequency component extracting portion 42b conducts an operation in which frequency components except for the second harmonics and the third harmonics are removed from the frequency distribution shown in FIG. 4B. It should be noted that the frequency f of the fundamental wave of the analog signal S10 which is outputted from the DUT 20 is known beforehand, and a control portion which is not shown in drawings outputs information indicating the frequency f to both the frequency component extracting portion 42a and 42b. The frequency component extracting portions 42a and 42b conduct the above-described operations based on the information.

The frequency components extracted by the frequency component extracting portions 42a and 42b are mixed by the mixing portion 43. In reference to FIG. 4C which shows the frequency component of the mixed signal, it is observed that the fundamental wave and the noise component N1 are almost the same as shown in FIG. 4A. Moreover, it is observed that the amplitudes of the second harmonic and the third harmonic of FIG. 4C are almost the same as FIG. 4B. In accordance with the above-described operations, it is possible to obtain a frequency distribution of a signal converted by an A/D converter which has both a high noise performance of the A/D converter 31a and a high distortion performance of the A/D converter 31b.

The SNR portion 44 and the THD portion 45 input the signal mixed by the mixing portion 43. The SNR portion 44 calculates the measurement result with regard to the noise performance (signal to noise ratio). The THD portion 45 calculates the measurement result with regard to the distortion performance (total harmonic distortion). The host computer which is not shown in the drawings inputs the measurement results obtained in accordance with the above-described operations and shows the measurement results on the display of the host computer. That is, the measurement result obtained by the SNR portion 44 is displayed as the noise characteristics of the analog signal S10 which is outputted from the DUT 20, and the measurement result obtained by the THD portion 45 is displayed as the distortion characteristics of the analog signal S10 which is outputted from the DUT 20.

As described above, the signal measuring apparatus 30 of the second embodiment includes: the multiple A/D converters 31*a* and 31*b* which respectively have different conversion characteristics; and the digital circuit 32 which mixes the digital signals outputted from the A/D converters 31*a* and 31*b* and which calculates the measurement results with regard to the multiple performances which are used for evaluating the conversion characteristics of the A/D converter. Therefore, the digital signal S31*a* converted by the A/D converter 31*a* which has a good noise performance and the digital signal S31*b* converted by the A/D converter 31*b* which has a good distortion performance are mixed, and it is possible to obtain both the preferable measurement results with regard to the noise performance and the preferable measurement results with regard to the distortion performance. Therefore, the second embodiment can satisfy both a noise performance and a distortion performance at a high level all together.

The signal measuring apparatuses of the embodiments are explained above. However, it should be noted that the above-described embodiments do not provide limitations on the present invention, and it is possible to appropriately apply changes additions, omissions, and the like to the above-described embodiments if they are inside the scope of the present invention. For example, in the above-described second embodiment, one case is explained in which the A/D converter 31*a* which has a good noise performance and the A/D converter 31*b* which has a good distortion performance are provided, and in which the noise performance and the distortion performance are measured. However, as described in the first embodiment, it is possible to arrange such as an A/D converter which has a good DC performance and an A/D converter which has a good spurious performance in parallel with the A/D converters 31*a* and 31*b* in order to measure the DC performance, the spurious performance, the noise performance, the distortion performance, and the like.

It is possible to use the signal measuring apparatuses of the above-described first and second embodiments as independent apparatuses for measuring analog signals. Moreover, it is possible to set the signal measuring apparatuses of the above-described embodiments to a semiconductor testing apparatus such as a memory tester and a logic tester in order to measure analog signals which are outputted from the DUT. It is possible to test digital signals and analog signals all together and it is possible to adapt the semiconductor testing apparatus to tests of various devices because the signal measuring apparatuses of the above-described embodiments are applied to the semiconductor testing apparatus.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A signal measuring apparatus which measures an analog signal by converting from the analog signal to digital signals, comprising:

a plurality of converters which convert from the analog signal to digital signals and which respectively have different conversion characteristics; and a plurality of operation portions arranged in correspondence with the converters and each of which conducts a predetermined operation based on the conversion characteristics of the corresponding converter, wherein each of the converters has one performance which is better than other converters and which is included in a plurality of performances used for evaluating the conversion characteristics, and the plurality of performances used for evaluating the conversion characteristics include at least one of DC performance, noise performance, distortion performance and spurious performance.

2. A signal measuring apparatus according to claim 1, wherein each of the operation portions obtains a measurement result with regard to the performance of the corresponding converter which is better than other converters and which is obtained by conducting a frequency analysis on the digital signal outputted from the corresponding converter.

3. A signal measuring apparatus according to claim 1, further comprising a signal processing portion which mixes the digital signals outputted from the converters in order to obtain measurement results with regard to a plurality of performances which are used for evaluating the conversion characteristics.

4. A signal measuring apparatus according to claim 3, wherein the signal processing portion comprises:

a frequency analysis portion which conducts a signal analysis on the digital signals outputted from the converters;

an extracting portion which extracts predetermined frequency components corresponding to the conversion characteristics of the converters based on analysis results of the frequency analysis portion; and a mixing portion which mixes the frequency components extracted by the extracting portion.

5. A signal measuring apparatus according to claim 3, wherein each of the converters has one performance which is better than other converters and which is included in the plurality of performances used for evaluating the conversion characteristics.

6. A semiconductor testing apparatus for testing a device under test comprising a signal measuring apparatus according to claim 1 in order to measure an analog signal outputted from the device under test by using the signal measuring apparatus.

7. A signal measuring apparatus of claim 1, wherein said plurality of converters simultaneously conduct conversion operations.

8. The signal measuring apparatus of claim 7, wherein said plurality of converters is a pair of converters including a first converter and a second converter, said first converter has better noise performance than the second converter, and said second converter has better distortion performance than the first converter.

9. A signal measuring apparatus of claim 8, wherein said first converter is a delta-sigma A/D converter, and said second converter is a successive approximation A/D converter.

10. A signal measuring apparatus of claim 8, wherein the noise characteristics are obtained by using the conversion results of the first converter while ignoring the conversion results of the second converter, and the distortion characteristics are obtained by using the conversion results of the second converter while ignoring the conversion results of the first converter.

11. A signal measuring apparatus of claim 8, further comprising a third converter having better DC performance than the first and second converters.

\* \* \* \* \*